United States Patent
Lin et al.

(10) Patent No.: US 12,365,758 B2
(45) Date of Patent: Jul. 22, 2025

(54) ENCAPSULATION STRUCTURE

(71) Applicant: INDUSTRIAL TECHNOLOGY RESEARCH INSTITUTE, Hsinchu (TW)

(72) Inventors: Cheng-Yi Lin, Hukou Township (TW); Shih-Ming Chen, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 1060 days.

(21) Appl. No.: 17/360,558

(22) Filed: Jun. 28, 2021

(65) Prior Publication Data

US 2022/0356342 A1 Nov. 10, 2022

(30) Foreign Application Priority Data

May 10, 2021 (TW) ................. 110116733

(51) Int. Cl.
| | | |
|---|---|---|
| H01L 23/29 | (2006.01) | |
| C08G 59/14 | (2006.01) | |
| C08J 5/18 | (2006.01) | |
| C08L 33/04 | (2006.01) | |
| C08L 63/00 | (2006.01) | |
| G02F 1/1333 | (2006.01) | |
| H10H 20/854 | (2025.01) | |
| H10K 50/844 | (2023.01) | |

(52) U.S. Cl.
CPC ............ *C08G 59/1477* (2013.01); *C08J 5/18* (2013.01); *C08L 33/04* (2013.01); *C08L 63/00* (2013.01); *C08J 2333/04* (2013.01); *C08J 2363/00* (2013.01); *C08J 2433/04* (2013.01); *C08J 2463/00* (2013.01); *C08L 2203/162* (2013.01); *C08L 2203/206* (2013.01); *G02F 1/133345* (2013.01); *H01L 23/293* (2013.01); *H10H 20/854* (2025.01); *H10K 50/844* (2023.02)

(58) Field of Classification Search
CPC ..................................................... C08L 63/00
See application file for complete search history.

(56) References Cited

U.S. PATENT DOCUMENTS

| | | |
|---|---|---|
| 2004/0196412 A1 | 10/2004 | Cariolato |
| 2019/0249044 A1 | 8/2019 | Clapper et al. |

FOREIGN PATENT DOCUMENTS

| | | | |
|---|---|---|---|
| CN | 103068946 A | | 4/2013 |
| CN | 104673127 A | | 6/2015 |
| CN | 105255418 A | | 1/2016 |
| CN | 105802515 A | | 5/2016 |
| CN | 106497498 A | | 3/2017 |
| CN | 106715500 A | | 5/2017 |
| CN | 107858118 A | | 3/2018 |
| CN | 108948280 A | | 12/2018 |
| CN | 109715395 A | | 5/2019 |
| CN | 110128773 | * | 8/2019 |
| CN | 110128773 A | | 8/2019 |
| CN | 110183706 A | | 8/2019 |
| CN | 110183995 A | | 8/2019 |
| CN | 110437569 A | | 11/2019 |
| CN | 106893017 B | | 12/2019 |
| JP | 2002-156754 A | | 5/2002 |
| JP | 2016-199673 A | | 12/2016 |
| KR | 10-2018-0029179 A | | 3/2016 |
| KR | 10-1663479 B1 | | 10/2016 |
| TW | I455982 B | | 10/2014 |
| TW | I621531 B | | 4/2018 |
| WO | WO 2018/019568 A1 | | 2/2016 |

OTHER PUBLICATIONS

English language translation CN 110128773 (Year: 2019).*
Chinese Office Action and Search Report for Chinese Application No. 202110504069.8, dated Dec. 29, 2023.
Taiwanese Office Action and Search Report for Taiwanese Application No. 110116733, dated Feb. 8, 2022.
Chinese Office Action and Search Report for Chinese Application No. 202110504069.8, dated Jul. 28, 2023.
Li et al., "Adhesive Application Technology", China Commercial Press, 1st Version, Dec. 31, 1989, pp. 293-296 (5 pages total), with an English abstract.
Zhao et al., "High Performance Thermosetting Resins", China Railway Publishing House Co., Ltd., 1st Version, Dec. 31, 2022, pp. 30-38 (10 pages total), with an English abstract.

* cited by examiner

*Primary Examiner* — Margaret G Moore

(74) *Attorney, Agent, or Firm* — Birch, Stewart, Kolasch & Birch, LLP

(57) ABSTRACT

A resin composition is provided, which includes a first polymer and a second polymer. The first polymer is formed by a reaction of an epoxy resin modified with a first elastic molecular segment and an epoxy resin curing agent. The second polymer is formed by a polymerization of an acrylate modified with a second elastic molecular segment.

11 Claims, No Drawings

ENCAPSULATION STRUCTURE

CROSS REFERENCE TO RELATED APPLICATIONS

The present application is based on, and claims priority from, Taiwan Application Serial Number 110116733, filed on May 10, 2021, the disclosure of which is hereby incorporated by reference herein in its entirety.

TECHNICAL FIELD

The technical field is related to resin, and in particular it is related to a resin composition, an encapsulation structure, and a method for manufacturing the resin composition.

BACKGROUND

Transparent displays and foldable displays applied in different fields (such as in open spaces, in education, in retail, and the like, or for personal use such as in flexible mobile phones, tablets, laptops, and the like) are often subject to touch or impact. In addition to being scratch-resistant and abrasion-resistant, the display panel needs a certain degree of impact resistance. Accordingly, it is important to increase the impact resistance of the display.

The conventional high-damping and pressure-sensitive adhesive products developed by international companies can exhibit low-temperature performance and adhesion, which are used to manufacture vibration-damping composite materials. However, the above material cannot serve as an impact energy absorption material in the transparent display field. At present, acrylate polymer (e.g. from 3M company) or silicone polymer (e.g. from General Silicone, Shin-Etsu Chemical, Dow Corning, and the like) are the major impact energy absorption materials for the transparent display.

Accordingly, development of a novel impact-resistant and transparent material is called for.

SUMMARY

One embodiment of the disclosure provides a resin composition, including a first polymer formed by a reaction of an epoxy resin modified with a first elastic molecular segment and an epoxy resin curing agent; and a second polymer formed by the polymerization of an acrylate modified with a second elastic molecular segment.

One embodiment of the disclosure provides an encapsulation structure, including: an optoelectronic device; and an encapsulant film packaging the optoelectronic device, and the encapsulant film includes: a first polymer formed by a reaction of an epoxy resin modified with a first elastic molecular segment and an epoxy resin curing agent; and a second polymer formed by the polymerization of an acrylate modified with a second elastic molecular segment.

One embodiment of the disclosure provides a method of forming a resin composition, including: mixing an epoxy resin modified with a first elastic molecular segment, an epoxy resin curing agent, an acrylate modified with a second elastic molecular segment, and an initiator, forming a first polymer by curing the epoxy resin modified with the first elastic molecular segment using the epoxy resin curing agent; and forming a second polymer by polymerizing the acrylate modified with the second elastic molecular segment using the initiator.

A detailed description is given in the following embodiments.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details.

One embodiment of the disclosure provides a resin composition, which may include a first polymer formed by a reaction of an epoxy resin modified with a first elastic molecular segment and an epoxy resin curing agent; and a second polymer formed by the polymerization of an acrylate modified with a second elastic molecular segment. The elastic molecular segment can be an elastic substance that is easily elongated under stress, and recovered after the stress is removed.

In some embodiments, the first polymer and the second polymer can be (but is not limited to) inter-penetrated to form an inter-penetrating network (IPN). If the first polymer and the second polymer are not inter-penetrated, the application temperature range will be narrow. For example, the epoxy resin only includes independently reactive epoxy group, and the acrylate only includes a double bond, such that the epoxy group and the double bond will not crosslink to each other. As such, the inter-penetrating network is possibly formed.

In some embodiments, the first elastic molecular segment and the second elastic molecular segment are the same. If the first elastic molecular segment and the second elastic molecular segment are different, the haze value of the material will be increased to affect its optical properties. In general, the first and the second elastic molecular segments may include (but is not limited to) polyurethane, rubber, dimer acid, polyether, polyester, or a combination thereof.

In some embodiments, both the first elastic molecular segment and the second elastic molecular segment are aliphatic, such as (but is not limited to) polyether aliphatic, polyester aliphatic, or a combination thereof.

In some embodiments, both the first elastic molecular segment and the second elastic molecular segment are aromatic, such as (but is not limited to) benzene ring aromatic, naphthalene ring aromatic, anthracene ring isomer, or a combination thereof.

In some embodiments, the epoxy resin modified with a first elastic molecular segment and the acrylate modified with a second elastic molecular segment have a weight ratio of 1:0.45 to 1:10, such as (but not limited to) about 1:0.5 to 1:8, about 1:0.5 to 1:6, about 1:0.5 to 1:4, about 1:0.5 to 1:2, about 1:1 to 1:8, about 1:1 to 1:6, about 1:1 to 1:4, about 1:1 to 1:2, or the like. If the acrylate modified with a second elastic molecular segment amount is too low, the application temperature range of the material will be narrow. If the acrylate modified with a second elastic molecular segment amount is too high, the damping peak of the material will be lowered.

In some embodiments, the epoxy resin modified with a first elastic molecular segment and the epoxy resin curing agent have a weight ratio of 1:0.2 to 1:0.8, but it is not limited thereto. If the epoxy resin curing agent amount is too low, the epoxy resin will not fully cure. The epoxy resin curing agent may include (but is not limited to) amine or anhydride. The epoxy resin curing agent may have a molecular weight of 230 to 5000, but it is not limited thereto.

In some embodiments, the resin composition has a haze value of ≤0.5%. If the haze value is higher than 0.5%, the resin composition will be improper to be applied in a device structure emphasizing transparency.

In some embodiments, the resin composition has a total transmittance of ≥90%. If the total transmittance is lower than 90%, the resin composition will be improper to be applied in a device structure emphasizing transparency.

In some embodiments, the resin composition has a Tan δ peak height of 0.7 to 1.2 at temperature range from −20° C. to 50° C. In addition, the interval between the upper temperature limit and the lower temperature limit of the resin composition having a Tan δ peak height of ≥0.7 is 10° C. to 30° C. The Tan δ is defined as E"/E', which indicates the energy dissipated through the internal movement of material molecules.

One embodiment of the disclosure provides an encapsulation structure, which may include (but is not limited to) an optoelectronic device; and an encapsulant film for packaging the optoelectronic device. The optoelectronic device may include (but is not limited to) LCD, OLED, micro LED, or the like. For example, the encapsulant may include (but is not limited to) a first polymer formed by a reaction of an epoxy resin modified with a first elastic molecular segment and an epoxy resin curing agent; and a second polymer formed by the polymerization of an acrylate modified with a second elastic molecular segment.

One embodiment of the disclosure provides a method of forming a resin composition, including (but not limited to) the following steps. An epoxy resin modified with a first elastic molecular segment, an epoxy resin curing agent, an acrylate modified with a second elastic molecular segment, and an initiator are mixed. A first polymer is formed by curing the epoxy resin modified with the first elastic molecular segment using the epoxy resin curing agent. A second polymer is formed by polymerizing the acrylate modified with the second elastic molecular segment using the initiator. For example, the initiator can be (but is not limited to) a photo initiator (e.g. UV initiator), a thermal initiator, or a combination thereof. The photo initiator can be free radical initiator, cationic initiator, or anionic initiator. The resin composition is similar to that described above, and the related description is not repeated here.

In some embodiments, the step of curing the epoxy resin modified with the first elastic molecular segment and the step of polymerizing the acrylate modified with the second elastic molecular segment are performed at the same time to form the resin composition. For example, the resin composition can be formed by simultaneously being exposed to UV and heat.

In some embodiments, the step of curing the epoxy resin modified with the first elastic molecular segment and the step of polymerizing the acrylate modified with the second elastic molecular segment are respectively performed to form the resin composition. For example, the resin composition can be firstly exposed to UV and then heated. The two-step curing and polymerization may fill the concave/convex surface or flat display panel to satisfy the requirements of the encapsulation process.

In terms of breakthrough benefits, the elastic/soft, high temperature resistant, and transparent film material of the disclosure is advantageous in wide temperature range application, high impact resistance (high damping), excellent optical properties, and the like, which can be integrated to a transparent display, a general display, a flexible display, or the like. Moreover, the film material may satisfy the process requirements of low temperature polysilicon thin film transistor (LTPS TFT).

Below, exemplary embodiments will be described in detail so as to be easily realized by a person having ordinary knowledge in the art. The inventive concept may be embodied in various forms without being limited to the exemplary embodiments set forth herein.

EXAMPLES

Example 1

33.33 g of epoxy resin modified with polyurethane (NPER-133L commercially available from Nan Ya Plastics) and 8.71 g of poly(propylene glycol) bis(2-aminopropyl ether) (commercially available from Sigma-Aldrich, CAS Number: 9046-10-0, Average Mn~230) were mixed at room temperature. Simultaneously, 16.67 g of acrylate modified with polyurethane (U022-122, commercially available from Evermore Chemical Industry Co., Ltd.), 0.59 g of UV photo initiator I (UVC-184, An Fong Development Co., Ltd.), and 0.29 g of UV photo initiator II (TPO, commercially available from Hou Chi Chemical Co., Ltd.) were mixed at room temperature. These two colloidal prepolymer solutions were mixed, stirred, and deaerated. The colloidal prepolymer solution was then successively coated onto a release glass substrate, exposed to UV to perform a polymerization, and then the coated glass was placed in an oven and baked at 80° C. for 2 hours to perform a curing reaction, thereby obtaining a resin composition.

Example 2

33.33 g of epoxy resin modified with polyurethane (NPER-133L commercially available from Nan Ya Plastics) and 8.71 g of poly(propylene glycol) bis(2-aminopropyl ether) (commercially available from Sigma-Aldrich, CAS Number: 9046-10-0, Average Mn~230) were mixed at room temperature. Simultaneously, 21.02 g of acrylate modified with polyurethane (U022-122, commercially available from Evermore Chemical Industry Co., Ltd.), 0.63 g of UV photo initiator I (UVC-184, An Fong Development Co., Ltd.) and 0.32 g of UV photo initiator II (TPO, commercially available from Hou Chi Chemical Co., Ltd.) were mixed at room temperature. These two colloidal prepolymer solutions were mixed, stirred, and deaerated. The colloidal prepolymer solution was then successively coated onto a release glass substrate, exposed to UV to perform a polymerization, and then the coated glass was placed in an oven and baked at 80° C. for 2 hours to perform a curing reaction, thereby obtaining a resin composition.

Example 3

33.33 g of epoxy resin modified with polyurethane (NPER-133L commercially available from Nan Ya Plastics) and 8.71 g of poly(propylene glycol) bis(2-aminopropyl ether) (commercially available from Sigma-Aldrich, CAS Number: 9046-10-0, Average Mn~230) were mixed at room temperature. Simultaneously, 42.04 g of acrylate modified with polyurethane (U022-122, commercially available from Evermore Chemical Industry Co., Ltd.), 0.84 g of UV photo initiator I (UVC-184, An Fong Development Co., Ltd.) and 0.42 g of UV photo initiator II (TPO, commercially available from Hou Chi Chemical Co., Ltd.) were mixed at room temperature. These two colloidal prepolymer solutions were mixed, stirred, and deaerated. The colloidal prepolymer solution was then successively coated onto a release glass substrate, exposed to UV to perform a polymerization, and then the coated glass was placed in an oven and baked at 80° C. for 2 hours to perform a curing reaction, thereby obtaining a resin composition.

Example 4

33.33 g of epoxy resin modified with polyurethane (NPER-133L commercially available from Nan Ya Plastics.) and 17.42 g of poly(propylene glycol) bis(2-aminopropyl ether) (commercially available from Sigma-Aldrich, CAS Number: 9046-10-0, Average Mn~230) were mixed at room temperature. Simultaneously, 50.75 g of acrylate modified with polyurethane (U022-122, commercially available from Evermore Chemical Industry Co., Ltd.), 1.02 g of UV photo initiator I (UVC-184, An Fong Development Co., Ltd.) and 0.51 g of UV photo initiator II (TPO, commercially available from Hou Chi Chemical Co., Ltd.) were mixed at room temperature. These two colloidal prepolymer solutions were mixed, stirred, and deaerated. The colloidal prepolymer solution was then successively coated onto a release glass substrate, exposed to UV to perform a polymerization, and then the coated glass was placed in an oven and baked at 80° C. for 2 hours to perform a curing reaction, thereby obtaining a resin composition.

Example 5

6.67 g of epoxy resin modified with polyurethane (NPER-133L commercially available from Nan Ya Plastics) and 1.74 g of poly(propylene glycol) bis(2-aminopropyl ether) (commercially available from Sigma-Aldrich, CAS Number: 9046-10-0, Average Mn~230) were mixed at room temperature. Simultaneously, 44.44 g of acrylate modified with polyurethane (U022-122, commercially available from Evermore Chemical Industry Co., Ltd.), 0.53 g of UV photo initiator I (UVC-184, An Fong Development Co., Ltd.) and 0.26 g of UV photo initiator II (TPO, commercially available from Hou Chi Chemical Co., Ltd.) were mixed at room temperature. These two colloidal prepolymer solutions were mixed, stirred, and deaerated. The colloidal prepolymer solution was then successively coated onto a release glass substrate, exposed to UV to perform a polymerization, and then the coated glass was placed in an oven and baked at 80° C. for 2 hours to perform a curing reaction, thereby obtaining a resin composition.

Comparative Example 1

1.67 g of epoxy resin modified with polyurethane (NPER-133L commercially available from Nan Ya Plastics) and 0.44 g of poly(propylene glycol) bis(2-aminopropyl ether) (commercially available from Sigma-Aldrich, CAS Number: 9046-10-0, Average Mn~230) were mixed at room temperature. Simultaneously, 21.02 g of acrylate modified with polyurethane (U022-122, commercially available from Evermore Chemical Industry Co., Ltd.), 0.23 g of UV photo initiator I (UVC-184, An Fong Development Co., Ltd.) and 0.12 g of UV photo initiator II (TPO, commercially available from Hou Chi Chemical Co., Ltd.) were mixed at room temperature. These two colloidal prepolymer solutions were mixed, stirred, and deaerated. The colloidal prepolymer solution was then successively coated onto a release glass substrate, exposed to UV to perform a polymerization, and then the coated glass was placed in an oven and baked at 80° C. for 2 hours to perform a curing reaction, thereby obtaining a resin composition.

Comparative Example 2

33.33 g of epoxy resin modified with polyurethane (NPER-133L commercially available from Nan Ya Plastics) and 8.71 g of poly(propylene glycol) bis(2-aminopropyl ether) (commercially available from Sigma-Aldrich, CAS Number: 9046-10-0, Average Mn~230) were mixed at room temperature. Simultaneously, 13.33 g of acrylate modified with polyurethane (U022-122, commercially available from Evermore Chemical Industry Co., Ltd.), 0.55 g of UV photo initiator I (UVC-184, An Fong Development Co., Ltd.) and 0.28 g of UV photo initiator II (TPO, commercially available from Hou Chi Chemical Co., Ltd.) were mixed at room temperature. These two colloidal prepolymer solutions were mixed, stirred, and deaerated. The colloidal prepolymer solution was then successively coated onto a release glass substrate, exposed to UV to perform a polymerization, and then the coated glass was placed in an oven and baked at 80° C. for 2 hours to perform a curing reaction, thereby obtaining a resin composition.

Comparative Example 3

Transparent glass sheet had a thickness of 0.72 mm.

Comparative Example 4

Transparent silicone sheet had a thickness of 0.27 mm.

Comparative Example 5

33.33 g of epoxy resin modified with polyurethane (NPER-133L commercially available from Nan Ya Plastics) and 8.71 g of poly(propylene glycol) bis(2-aminopropyl ether) (commercially available from Sigma-Aldrich, CAS Number: 9046-10-0, Average Mn~230) were stirred and deaerated. The colloidal prepolymer solution was then coated onto a release glass substrate and then the coated glass was placed in an oven and baked at 80° C. for 2 hours to perform a curing reaction, thereby obtaining a resin composition.

Comparative Example 6

20 g of acrylate modified with polyurethane (U022-122, commercially available from Evermore Chemical Industry Co., Ltd.), 0.2 g of UV photo initiator I (UVC-184, An Fong Development Co., Ltd.) and 0.1 g of UV photo initiator II (TPO, commercially available from Hou Chi Chemical Co., Ltd.) were stirred and deaerated. The colloidal prepolymer solution was then coated onto a release glass substrate, and then exposed to UV to perform a polymerization, thereby obtaining a resin composition.

Comparative Example 7

33.33 g of epoxy resin modified with polyurethane (NPER-133L commercially available from Nan Ya Plastics) and 8.71 g of poly(propylene glycol) bis(2-aminopropyl ether) (commercially available from Sigma-Aldrich, CAS Number: 9046-10-0, Average Mn~230) were mixed at room temperature. Simultaneously, 42.04 g of dimethacrylate modified with polyurethane (DM5220, commercially available from Double Bond Chemical Ind., Co., Ltd.), 0.84 g of UV photo initiator I (UVC-184, An Fong Development Co., Ltd.) and 0.42 g of UV photo initiator II (TPO, commercially available from Hou Chi Chemical Co., Ltd.) were mixed at room temperature. These two colloidal prepolymer solutions were mixed, stirred, and deaerated. The colloidal prepolymer solution was then successively coated onto a release glass substrate, exposed to UV to perform a polymerization, and then the coated glass was placed in an oven and baked at 80° C. for 2 hours to perform a curing reaction, thereby obtaining a resin composition.

Comparative Example 8

10 g of epoxy resin (NPEL-128 commercially available from Nan Ya Plastics) and 3.11 g of poly(propylene glycol) bis(2-aminopropyl ether) (commercially available from Sigma-Aldrich, CAS Number: 9046-10-0, Average Mn~230) were mixed at room temperature. Simultaneously, 13.11 g of acrylate modified with polyurethane (U022-122, commercially available from Evermore Chemical Industry Co., Ltd.), 0.26 g of UV photo initiator I (UVC-184, An Fong Development Co., Ltd.) and 0.13 g of UV photo initiator II (TPO, commercially available from Hou Chi Chemical Co., Ltd.) were mixed at room temperature. These two colloidal prepolymer solutions were mixed, stirred, and deaerated. The colloidal prepolymer solution was then successively coated onto a release glass substrate, exposed to UV to perform a polymerization, and then the coated glass was placed in an oven and baked at 80° C. for 2 hours to perform a curing reaction, thereby obtaining a resin composition.

Comparative Example 9

33.33 g of epoxy resin modified with polyurethane (NPER-133L commercially available from Nan Ya Plastics) and 8.71 g of poly(propylene glycol) bis(2-aminopropyl ether) (commercially available from Sigma-Aldrich, CAS Number: 9046-10-0, Average Mn~230) were mixed at room temperature. Simultaneously, 42.04 g of acrylate (23-EGMA, commercially available from Hou Chi Chemical Co., Ltd.), 0.84 g of UV photo initiator I (UVC-184, An Fong Development Co., Ltd.) and 0.42 g of UV photo initiator II (TPO, commercially available from Hou Chi Chemical Co., Ltd.) were mixed at room temperature. These two colloidal prepolymer solutions were mixed, stirred, and deaerated. The colloidal prepolymer solution was then successively coated onto a release glass substrate, exposed to UV to perform a polymerization, and then the coated glass was placed in an oven and baked at 80° C. for 2 hours to perform a curing reaction, thereby obtaining a resin composition.

Comparative Example 10

10 g of epoxy resin (NPEL-128 commercially available from Nan Ya Plastics) and 3.11 g of poly(propylene glycol) bis(2-aminopropyl ether) (commercially available from Sigma-Aldrich, CAS Number: 9046-10-0, Average Mn~230) were mixed at room temperature. Simultaneously, 13.11 g of acrylate (23-EGMA, commercially available from Hou Chi Chemical Co., Ltd.), 0.26 g of UV photo initiator I (UVC-184, An Fong Development Co., Ltd.) and 0.13 g of UV photo initiator II (TPO, commercially available from Hou Chi Chemical Co., Ltd.) were mixed at room temperature. These two colloidal prepolymer solutions were mixed, stirred, and deaerated. The colloidal prepolymer solution was then successively coated onto a release glass substrate, exposed to UV to perform a polymerization, and then the coated glass was placed in an oven and baked at 80° C. for 2 hours to perform a curing reaction, thereby obtaining a resin composition.

Example 6

The haze value, total transmittance (T.T.), and Tan δ peak heights of the products prepared in Examples 1 to 5 and Comparative Examples 1 to 10 were measured. The optical properties were measured according to the standard ASTM D1003. The Tan δ peak heights were measured by dynamic mechanical analysis (DMA) according to the standard IPC-TM-650, which scanning temperature ranged from −50° C. to 50° C. to obtain the Tan δ peak height, and both an upper and a lower temperature limit (temperature interval) of the resin composition having a Tan δ peak height of ≥0.7. Moreover, the upper temperature limit and the lower temperature limit were used to calculate the temperature interval therebetween, as shown in Table 1.

TABLE 1

| No. | Material (Weight ratio of the epoxy resin modified with polyurethane and theacrylate modified with polyurethane) | Haze value (%) | Total transmittance (T.T., (%)) | Tan δ peak height | Temperature interval of Tan δ peak height ≥ 0.7 (ΔT, ° C.) |
|---|---|---|---|---|---|
| Example 1 | 1:0.50 | 0.2 | 92.2 | 1.1 | 14~35 (21) |
| Example 2 | 1:0.63 | 0.2 | 91.6 | 1.1 | 11~32 (21) |
| Example 3 | 1:1.26 | 0.2 | 92.4 | 1.1 | 0~30 (30) |
| Example 4 | 1:1.52 | 0.3 | 92.0 | 1.2 | −17~10 (27) |
| Example 5 | 1:6.67 | 0.2 | 92.5 | 1.0 | 28~48 (20) |
| Comparative Example 1 | 1:12.59 | 0.2 | 92.4 | 0.6 | N.A. (Tan δ peak height < 0.7) |
| Comparative Example 2 | 1:0.40 | 0.2 | 92.1 | 1.0 | 16~23 (7) |

(N. A. = Not Applicable)

As shown in Table 1, all the haze values in Examples 1-5 were ≤0.5%, all the total transmittance in Examples 1 to 5 were ≥90%, all the Tan δ peak heights in Examples 1 to 5 were ≥0.7, and the ranges of the temperature interval (ΔT) of Tan δ peak heights≥0.7 were larger than or equal to 20° C. or even reaching an interval of 30° C. As shown in the Tan δ peak height measurements in Comparative Examples 1 and 2, higher weight ratio of acrylate modified with the polyurethane resulted in the Tan δ peak height of <0.7. While lower weight ratio of acrylate modified with the polyurethane retained a Tan δ peak height of 1.0 (0.7), but the range of the temperature interval (ΔT) of Tan δ peak height ≥0.7 was narrower than 20° C.

TABLE 2

| No. | Material | Haze value (%) | Total transmittance (T.T., (%)) | Tan δ peak height | Temperature interval of Tan δ peak height ≥ 0.7 (ΔT, ° C.) |
|---|---|---|---|---|---|
| Comparative Example 3 | Transparent glass sheet | 0.2 | 92.0 | N.A. | N.A. |
| Comparative Example 4 | Transparent silicone sheet | 15.5 | 91.6 | N.D. | N.D. |
| Comparative Example 5 | Epoxy resin modified with polyurethane | 0.2 | 92.0 | 1.1 | 21~29 (8) |
| Comparative Example 6 | Acrylate modified with polyurethane | 0.2 | 92.4 | 0.6 | N.A. |
| Comparative Example 7 | Epoxy resin modified with polyurethane andthe acrylate modified with different polyurethane | 92.0 | 84.2 | 1.1 | 2~23 (21) |
| Comparative Example 8 | Epoxy resin and acrylate modified with polyurethane | 67.7 | 90.6 | 1.0 | 15~28 (13) |
| Comparative Example 9 | Epoxy resin modified with polyurethane and acrylate | 0.9 | 91.2 | 0.7 | 9~14 (5) |
| Comparative Example 10 | Epoxy resin and acrylate | 0.4 | 92.1 | 0.5 | N.A. |

(N.A. = Not Applicable ;
N.D. = Not Detected)

As shown in Tables 1 and 2, the haze values, total transmittance, Tan δ peak height, and the range of the temperature interval of Tan δ peak height≥0.7 of the resin compositions in Examples 1 to 5 are obviously better than those of the conventional transparent glass sheet and the transparent silicone sheet.

If the epoxy resin modified with the polyurethane was used alone (Comparative Example 5), the range of the temperature interval of Tan δ peak height≥0.7 would be narrower than 10° C. If the acrylate resin modified with the polyurethane was used alone (Comparative Example 6), the Tan δ peak height would not reach 0.7.

If the polyurethane segments of the epoxy resin modified with the polyurethane and the acrylate modified with the other polyurethane were different, the compatibility would be degraded to greatly increase the haze value and decrease the total transmittance.

If the epoxy resin (without being modified with the polyurethane) and the acrylate modified with the polyurethane were adopted, the haze value would also be greatly increased. If the epoxy resin modified with the polyurethane and the acrylate (without being modified with the polyurethane) were adopted, the temperature interval of Tan δ peak height≥0.7 would be only 5° C. If both the epoxy resin and the acrylate were not modified with the polyurethane, the haze value would be poor and the Tan δ peak height would not reach 0.7.

Accordingly, the elastic/soft, high temperature resistant, and transparent film material of the disclosure is advantageous in wide temperature range application, high impact resistance (high damping), and excellent optical properties, and the like, which can be integrated to a transparent display, a general display, a flexible display, and the like. Moreover, the film material may satisfy the process requirements of low temperature polysilicon thin film transistor (LTPS TFT).

It will be apparent to those skilled in the art that various modifications and variations can be made to the disclosed methods and materials. It is intended that the specification and examples be considered as exemplary only, with the true scope of the disclosure being indicated by the following claims and their equivalents.

What is claimed is:

1. An encapsulation structure, comprising:
    an optoelectronic device; and
    an encapsulant film packaging the optoelectronic device, wherein the encapsulant film includes:
    a first polymer formed by a reaction of an epoxy resin modified with a first elastic molecular segment and an epoxy resin curing agent; and
    a second polymer formed by polymerization of an acrylate modified with a second elastic molecular segment.

2. The encapsulation structure as claimed in claim 1, wherein the first polymer and the second polymer are inter-penetrated.

3. The encapsulation structure as claimed in claim 1, wherein the first elastic molecular segment and the second elastic molecular segment are the same, and include polyurethane, rubber, dimer acid, polyether, polyester, or a combination thereof.

4. The encapsulation structure as claimed in claim 1, wherein both the first elastic molecular segment and the second elastic molecular segment are aliphatic.

5. The encapsulation structure as claimed in claim 1, wherein both the first elastic molecular segment and the second elastic molecular segment are aromatic.

6. The encapsulation structure as claimed in claim 1, wherein the epoxy resin modified with a first elastic molecular segment and the acrylate modified with a second elastic molecular segment have a weight ratio of 1:0.45 to 1:10.

7. The encapsulation structure as claimed in claim 1, wherein the epoxy resin modified with a first elastic molecular segment and the epoxy resin curing agent have a weight ratio of 1:0.2 to 1:0.8.

8. The encapsulation structure as claimed in claim 1, having a haze value of ≤0.5%.

9. The encapsulation structure as claimed in claim 1, having a total transmittance of ≥90%.

10. The encapsulation structure as claimed in claim 1, having a Tan δ peak height of 0.7 to 1.2 at temperature range from −20° C. to 50° C.

11. The encapsulation structure as claimed in claim 1, wherein a temperature interval between an upper temperature limit and a lower temperature limit of the resin composition having a Tan δ peak height of ≥0.7 is 10° C. to 30° C.

* * * * *